US011315620B2

(12) United States Patent
Ishikawa et al.

(10) Patent No.: US 11,315,620 B2
(45) Date of Patent: Apr. 26, 2022

(54) SEMICONDUCTOR DEVICE PERFORMING ROW HAMMER REFRESH OPERATION

(71) Applicant: MICRON TECHNOLOGY, INC., Boise, ID (US)

(72) Inventors: Toru Ishikawa, Sagamihara (JP); Takuya Nakanishi, Hino (JP); Shinji Bessho, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/824,460

(22) Filed: Mar. 19, 2020

(65) Prior Publication Data
US 2020/0219556 A1    Jul. 9, 2020

Related U.S. Application Data

(63) Continuation of application No. 16/818,989, filed on Mar. 13, 2020, which is a continuation of application No. 16/788,657, filed on Feb. 12, 2020, now abandoned, which is a continuation of application No. 16/208,217, filed on Dec. 3, 2018, now abandoned.

(51) Int. Cl.
*G11C 7/00* (2006.01)
*G11C 11/406* (2006.01)
*G11C 11/4076* (2006.01)
*G11C 11/408* (2006.01)

(52) U.S. Cl.
CPC .... *G11C 11/40615* (2013.01); *G11C 11/4076* (2013.01); *G11C 11/4087* (2013.01)

(58) Field of Classification Search
CPC .......... G11C 11/40615; G11C 11/4076; G11C 11/4087

USPC ......................................................... 365/222
See application file for complete search history.

(56) References Cited

U.S. PATENT DOCUMENTS

| 5,299,159 | A | 3/1994 | Balistreri et al. |
| 5,654,929 | A | 8/1997 | Mote, Jr. |
| 5,699,297 | A | 12/1997 | Yamazaki et al. |
| 5,867,442 | A | 2/1999 | Kim et al. |
| 5,933,377 | A | 8/1999 | Hidaka |
| 5,943,283 | A | 8/1999 | Wong et al. |
| 5,956,288 | A | 9/1999 | Bermingham et al. |
| 5,959,923 | A | 9/1999 | Matteson et al. |

(Continued)

FOREIGN PATENT DOCUMENTS

| CN | 101038785 A | 9/2007 |
| CN | 101067972 A | 11/2007 |

(Continued)

OTHER PUBLICATIONS

International Search Report & Written Opinion dated Mar. 24, 2020 for PCT Application No. PCT/US2019/064028, 11 pages.

(Continued)

*Primary Examiner* — Tha-O H Bui
(74) *Attorney, Agent, or Firm* — Dorsey & Whitney LLP

(57) ABSTRACT

Disclosed herein is an apparatus that includes a memory cell array including a plurality of word lines each coupled to a plurality of memory cells, and a control circuit configured to activate first and second internal signals in a time-division manner in response to a first external command. A first number of the word lines are selected in response to the first internal signal, and a second number of the word line is selected in response to the second internal signal, the second number is smaller than the first number.

8 Claims, 18 Drawing Sheets

(56) References Cited

U.S. PATENT DOCUMENTS

| | | |
|---|---|---|
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 * | 4/2016 | Hong .................. G11C 29/783 |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 * | 7/2016 | Yoon .................. G11C 11/40615 |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 * | 6/2017 | Park .................. G11C 11/4085 |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |

(56) References Cited

U.S. PATENT DOCUMENTS

| | | |
|---|---|---|
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1* | 10/2013 | Jeong .................. G11C 11/408 365/222 |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1* | 8/2014 | Yu .................. G11C 11/40603 365/222 |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0162064 A1 | 6/2015 | Oh et al. |
| 2015/0162067 A1 | 6/2015 | Kim |
| 2015/0170728 A1 | 6/2015 | Jung |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |

(56) References Cited

U.S. PATENT DOCUMENTS

| | | |
|---|---|---|
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1* | 8/2018 | Wolff ............... G11C 11/40615 |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beiseie et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |

FOREIGN PATENT DOCUMENTS

| | | |
|---|---|---|
| CN | 104350546 A | 2/2015 |
| CN | 106710621 A | 5/2017 |
| CN | 107871516 A | 4/2018 |

(56) References Cited

FOREIGN PATENT DOCUMENTS

| | | | |
|---|---|---|---|
| JP | 2005-216423 | A | 8/2005 |
| JP | 2011-258259 | | 12/2011 |
| JP | 2011-258259 | A | 12/2011 |
| JP | 4911510 | B2 | 1/2012 |
| JP | 2013-004158 | A | 1/2013 |
| JP | 6281030 | B1 | 1/2018 |
| WO | 2014120477 | | 8/2014 |
| WO | 2015030991 | A1 | 3/2015 |
| WO | 2017171927 | A1 | 10/2017 |
| WO | 2019222960 | A1 | 11/2019 |
| WO | 2020010010 | A1 | 1/2020 |
| WO | 2020247163 | A1 | 12/2020 |
| WO | 2020247639 | A1 | 12/2020 |

OTHER PUBLICATIONS

U.S. Appl. No. 17/187,002 titled "Apparatuses and Methods for Staggered Timing of Targeted Refresh Operations" filed Feb. 26, 2021, pp. all.
U.S. Appl. No. 16/797,658, titles "Apparatuses and Methods for Controlling Refresh Operations", filed Feb. 21, 2020, pp. specification, claims, abstract, and figures of application as filed.
U.S. Appl. No. 16/818,981 titled "Apparatuses and Methods for Staggered Timing of Targeted Refresh Operations" filed Mar. 13, 2020, pp. specification, claims, abstract, and figures of application as filed.
U.S. Appl. No. 16/025,844, titled "Apparatus and Methods for Triggering Row Hammer Address Sampling", filed Jul. 2, 2018, pp. specification, claims, abstract, and figures of application as filed.
U.S. Appl. No. 16/783,063, titled "Apparatus and Methods for Triggering Row Hammer Address Sampling", dated Feb. 5, 2020, pp. specification, claims, abstract, and figures of application as filed.
U.S. Appl. No. 16/805,197, titled "Apparatuses and Methods for Calculating Row Hammer Refresh Addresses in a Semiconductor Device", dated Feb. 28, 2020, pp. specification, claims, abstract, and figures of application as filed.
U.S. Appl. No. 16/232,837, titled "Apparatuses and Methods for Distributed Targeted Refresh Operations", filed Dec. 26, 2018, pp. specification, claims, abstract, and figures of application as filed.
U.S. Appl. No. 16/818,989, titled "Semiconductor Device Performing Row Hammer Refresh Operation", dated Mar. 13, 2020, pp. specification, claims, abstract, and figures of application as filed.
U.S. Appl. No. 16/268,818, titled "Apparatuses and Methods for Managing Row Access Counts", filed Feb. 6, 2019, pp. specification, claims, abstract, and figures of application as filed.
U.S. Appl. No. 16/286,187 titled "Apparatuses and Methods for Memory Mat Refresh Sequencing" filed on Feb. 26, 2019, pp. specification, claims, abstract, and figures of application as filed.
U.S. Appl. No. 16/084,119, titled "Apparatuses and Methods for Pure-Time, Self Adopt Sampling for Row Hammer Refresh Sampling", filed Sep. 11, 2017, pp. specification, claims, abstract, and figures of application as filed.
U.S. Appl. No. 16/886,284 titled "Apparatuses and Methods for Access Based Refresh Timing" filed May 28, 2020, pp. specification, claims, abstract, and figures of application as filed.
U.S. Appl. No. 16/886,284, titled "Apparatuses and Methods for Access Based Refresh Timing", dated May 28, 2020, pp. specification, claims, abstract, and figures of application as filed.
U.S. Appl. No. 16/358,587, titled "Semiconductor Device Having CAM that Stores Address Signals", filed Feb. 6, 2019, pp. specification, claims, abstract, and figures of application as filed.
U.S. Appl. No. 16/375,716 titled "Apparatuses and Methods for Staggered Timing of Targeted Refresh Operations" filed on Apr. 4, 2019, pp. specification, claims, abstract, and figures of application as filed.
U.S. Appl. No. 16/411,573 titled "Apparatuses, Systems, and Methods for a Content Addressable Memory Cell" filed May 14, 2019, pp. specification, claims, abstract, and figures of application as filed.
U.S. Appl. No. 16/428,625 titled "Apparatuses and Methods for Tracking Victim Rows" filed May 31, 2019, pp. specification, claims, abstract, and figures of application as filed.
U.S. Appl. No. 16/432,604 titled "Apparatuses and Methods for Staggered Timing of Skipped Refresh Operations" filed Jun. 5, 2019, pp. specification, claims, abstract, and figures of application as filed.
U.S. Appl. No. 17/008,396 titled "Apparatuses and Methods for Staggered timing of Targeted Refresh Operations" filed Aug. 31, 2020, pp. specification, claims, abstract, and figures of application as filed.
U.S. Appl. No. 16/513,400 titled "Apparatuses and Methods for Tracking Row Access" filed Jul. 16, 2019, pp. specification, claims, abstract, and figures of application as filed.
U.S. Appl. No. 16/548,027 titled "Apparatuses, Systems and Methods for Analog Row Access Rate Determination" filed Jun. 5, 2019, pp. specification, claims, abstract, and figures of application as filed.
U.S. Appl. No. 16/549,942 titled "Apparatuses and Methods for Lossy Row Access Counting" filed Aug. 23, 2019, pp. specification, claims, abstract, and figures of application as filed.
U.S. Appl. No. 16/546,152 titled "Apparatuses and Methods for Analog Row Access Tracking" filed Aug. 20, 2019, pp. specification, claims, abstract, and figures of application as filed.
U.S. Appl. No. 16/549,411 titled "Apparatuses and Methods for Dynamic Refresh Allocation" filed Aug. 23, 2019, pp. specification, claims, abstract, and figures of application as filed.
U.S. Appl. No. 16/655,110 titled "Apparatuses and Methods for Dynamic Targeted Refresh Steals" filed Oct. 16, 2019, pp. specification, claims, abstract, and figures of application as filed.
U.S. Appl. No. 17/186,913 titled "Apparatuses and Methods for Dynamic Refresh Allocation" filed Feb. 26, 2021, pp. specification, claims, abstract, and figures of application as filed.
U.S. Appl. No. 17/187,002 titled "Apparatuses and Methods for Staggered Timing of Targeted Refresh Operations" filed Feb. 26, 2021, pp. specification, claims, abstract, and figures of application as filed.
U.S. Appl. No. 17/347,957 titled "Apparatuses and Methods for Controlling Steal Rates" filed Jun. 15, 2021, pp. specification, claims, abstract, and figures of application as filed.
U.S. Appl. No. 16/788,657 titled "Semiconductor Device Performing Row Hammer Refresh Operation", dated Feb. 12, 2020, pp. specification, claims, abstract, and figures of application as filed.
U.S. Appl. No. 17/324,621 titled "Apparatuses and Methods for Pure-Time, Self-Adopting Sampling for Row Hammer Refresh Sampling" filed May 19, 2021, pp. specification, claims, abstract, and figures of application as filed.
U.S. Appl. No. 15/881,256 entitled 'Apparatuses and Methods for Detecting a Row Hammer Attack with a Bandpass Filter' filed on Jan. 26, 2018, pp. specification, claims, abstract, and figures of application as filed.
U.S. Appl. No. 16/425,525 titled "Apparatuses And Methods For Tracking All Row Accesses" filed May 29, 2019, pp. specification, claims, abstract, and figures of application as filed.
U.S. Appl. No. 16/427,105 titled "Apparatuses And Methods for Priority Targeted Refresh Operations" filed May 30, 2019, pp. specification, claims, abstract, and figures of application as filed.
U.S. Appl. No. 16/427,140 titled "Apparatuses and Methods for Tracking Row Access Counts Between Multiple Register Stacks" filed May 30, 2019, pp. specification, claims, abstract, and figures of application as filed.
U.S. Appl. No. 16/437,811 titled "Apparatuses, Systems, and Methods for Determining Extremum Numerical Values" filed Jun. 11, 2019, pp. specification, claims, abstract, and figures of application as filed.
U.S. Appl. No. 16/537,891 titled "Apparatuses and Methods for Controlling Targeted Refresh Rates" filed Aug. 12, 2019, pp. specification, claims, abstract, and figures of application as filed.
U.S. Appl. No. 16/994,338 titled "Apparatuses, Systems, and Methods for Memory Directed Access Pause" filed Aug. 14, 2020, pp. specification, claims, abstract, and figures of application as filed.
U.S. Appl. No. 16/997,766 titled "Refresh Logic Circut Layouts Thereof" filed Aug. 19, 2020, pp. specification, claims, abstract, and figures of application as filed.

(56) References Cited

OTHER PUBLICATIONS

U.S. Appl. No. 16/997,659 titled "Apparatuses, Systems, and Methods for Refresh Modes" filed Aug. 19, 2020, pp. specification, claims, abstract, and figures of application as filed.
U.S. Appl. No. 17/095,978 titled "Apparatuses and Methods for Controlling Refresh Timing" filed Nov. 12, 2020, pp. specification, claims, abstract, and figures of application as filed.
U.S. Patent Application 17/127,654 titled "Apparatuses and Methods for Row Hammer Based Cache Lockdown" filed Dec. 18, 2020, pp. specification, claims, abstract, and figures of application as filed.
U.S. Appl. No. 17/175,485 titled "Apparatuses and Methods for Distributed Targeted Refresh Operations" filed Feb. 12, 202.1, pp. specification, claims, abstract, and figures of application as filed.
U.S. Appl. No. 15/789,897, entitled "Apparatus and Methods for Refreshing Memory", filed Oct. 20, 2017, pp. specification, claims, abstract, and figures of application as filed.
U.S. Appl. No. 15/796,340, entitled: "Apparatus and Methods for Refreshing Memory" filed on Oct. 27, 2017, pp. specification, claims, abstract, and figures of application as filed.
U.S. Appl. No. 16/012,679, titled "Apparatuses and Methods for Multiple Row Hammer Refresh Address Sequences", filed Jun. 19, 2018, pp. specification, claims, abstract, and figures of application as filed.
U.S. Appl. No. 16/020,863, titled "Semiconductor Device", filed Jun. 27, 2018, pp. specification, claims, abstract, and figures of application as filed.
U.S. Appl. No. 16/112,471 titled "Apparatuses and Methods for Controlling Refresh Operations" filed Aug. 24, 2018, pp. specification, claims, abstract, and figures of application as filed.
U.S. Appl. No. 16/160,801, titled "Apparatuses and Methods for Selective Row Refreshes" filed on Oct. 15, 2018, pp. specification, claims, abstract, and figures of application as filed.
U.S. Appl. No. 16/176,932, titled "Apparatuses and Methods for Access Based Refresh Timing", filed Oct. 31, 2018, pp. specification, claims, abstract, and figures of application as filed.
U.S. Appl. No. 16/230,300, titled "Apparatuses and Methods for Staggered Timing of Targeted Refresh Operations" filed Dec. 21, 2018, pp. specification, claims, abstract, and figures of application as filed ,.
U.S. Appl. No. 16/231,327 titled "Apparatuses and Methods for Selective Row Refreshes", filed on Dec. 21, 2018, pp. specification, claims, abstract, and figures of application as filed.
U.S. Appl. No. 16/237,291, titled "Apparatus and Methods for Refreshing Memory", filed Dec. 31, 2018, pp. specification, claims, abstract, and figures of application as filed.
U.S. Appl. No. 16/290,730, titled "Semiconductor Device Performing Row Hammer Refresh Operation", filed Mar. 1, 2019, pp. specification, claims, abstract, and figures of application as filed.
U.S. Appl. No. 16/374,623, titled "Semiconductor Device Performing Row Hammer Refresh Operation", filed Apr. 3, 2019, pp. specification, claims, abstract, and figures of application as filed.
U.S. Appl. No. 16/411,698 title "Semiconductor Device" filed May 14, 2019, pp. specification, claims, abstract, and figures of application as filed.
U.S. Appl. No. 16/427,330 titled "Apparatuses and Methods for Storing Victim Row Data" filed May 30, 2019, pp. specification, claims, abstract, and figures of application as filed.
U.S. Appl. No. 16/431,641 titled "Apparatuses and Methods for Controlling Steal Rates" filed Jun. 4, 2019, pp. specification, claims, abstract, and figures of application as filed.
U.S. Appl. No. 16/682,606, titled "Apparatuses and Methods for Distributing Row Hammer Refresh Events Across a Memory Device ", filed Nov. 13, 2019, pp. specification, claims, abstract, and figures of application as filed.
U.S. Appl. No. 15/876,566 entitled 'Apparatuses and Methods for Calculating Row Hammer Refresh Addresses in a Semiconductoe Device ' filed on Jan. 22, 2018, pp. specification, claims, abstract, and figures of application as filed.
U.S. Appl. No. 15/656,084, titled "Apparatuses and Methods for Targeting Refreshing ogf Memory", filed Jul. 21, 2019, pp. specification, claims, abstract, and figures of application as filed.
U.S. Appl. No. 17/226,975, titled "Apparatuses and Methods for Staggered Timing of Skipped Refresh Operations" filed Apr. 9, 2021, pp. specification, claims, abstract, and figures of application as filed.
U.S. Appl. No. 16/459,520 titled "Apparatuses and Methods for Monitoring Word Line Accesses", filed Jul. 1, 2019, pp. specification, claims, abstract, and figures of application as filed.
U.S. Appl. No. 155/715,846, entitled "Semiconductor Device", filed Sep. 26, 2017, pp. specification, claims, abstract, and figures of application as filed.
U.S. Appl. No. 15/888,993, entitled "Apparatuses and Methods for Controlling Refresh Operations", filed Feb. 5, 2018, pp. specification, claims, abstract, and figures of application as filed.
U.S. Appl. No. 16/190,627 titled "Apparatuses and Methods for Targeted Refreshing of Memory" filed Nov. 14, 2018, pp. specification, claims, abstract, and figures of application as filed.
U.S. Appl. No. 17/030,018, titled "Apparatuses and Methods for Controlling Refresh Operations", filed Sep. 23, 2020, pp. specification, claims, abstract, and figures of application as filed.
U.S. Appl. No. 15/281,818, titled "Semiconductor Device" filed on Sep. 30, 2016, pp. specification, claims, abstract, and figures of application as filed.
U.S. Appl. No. 17/654,035, titled "Apparatuses and Methods for Dynamic Targeted Refresh Steals", filed Mar. 8, 2022; pp. all pages of application as filed.

* cited by examiner

SEMICONDUCTOR DEVICE PERFORMING ROW HAMMER REFRESH OPERATION

CROSS REFERENCE TO RELATED APPLICATION(S)

This application is a continuation of U.S. application Ser. No. 16/818,989 filed Mar. 13, 2020, which is a continuation of U.S. application Ser. No. 16/788,657 filed Feb. 12, 2020, which is a continuation of U.S. application Ser. No. 16/208,217 filed Dec. 3, 2018. The aforementioned applications are incorporated herein by reference, in their entirety, for any purpose.

BACKGROUND

If accesses are concentrated to the same word line in a semiconductor device such as a DRAM (Dynamic Random Access Memory), information storage characteristics of memory cells coupled to word lines adjacent to that word line may be decreased. To solve this problem, a refresh operation for the memory cells coupled to the adjacent word lines is sometimes performed in addition to the normal refresh operation to prevent loss of information of the relevant memory cells. This additional refresh operation is called "row hammer refresh".

Generally, the row hammer refresh operation is performed so as to interrupt the normal refresh operation. Accordingly, if the frequency of the row hammer refresh operations is increased, it leads to a problem that the number of the normal refresh operations is reduced and the refresh cycle becomes longer.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
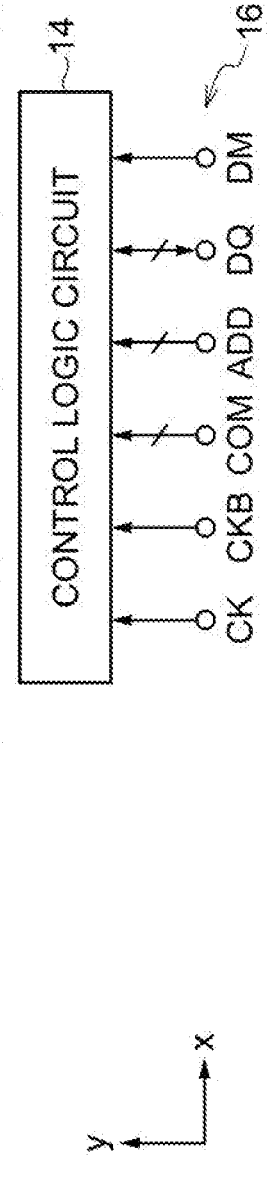
FIG. 1 is a block diagram of a semiconductor device according to a first embodiment of the present disclosure.

A semiconductor device 1 according to a first embodiment shown in FIG. 1 is a DRAM and includes eight memory banks BANK0 to BANK7, bank row logic circuits 12 respectively allocated to the memory banks BANK0 to BANK7, a control logic circuit 14 that controls the entire operation of the semiconductor device 1, and a plurality of external terminals 16. The memory banks BANK0 to BANK7 are arrayed in an x direction. Each of the memory banks BANK0 to BANK7 is divided into eight memory mats MAT0 to MAT7 arranged in a y direction. The external terminals 16 include external terminals to which clock signals CK and CKB, an external command COM, an external address signal ADD, and a data mask signal DM are respectively input, and an external terminal that performs input/output of read data/write data DQ.

Figure 2:
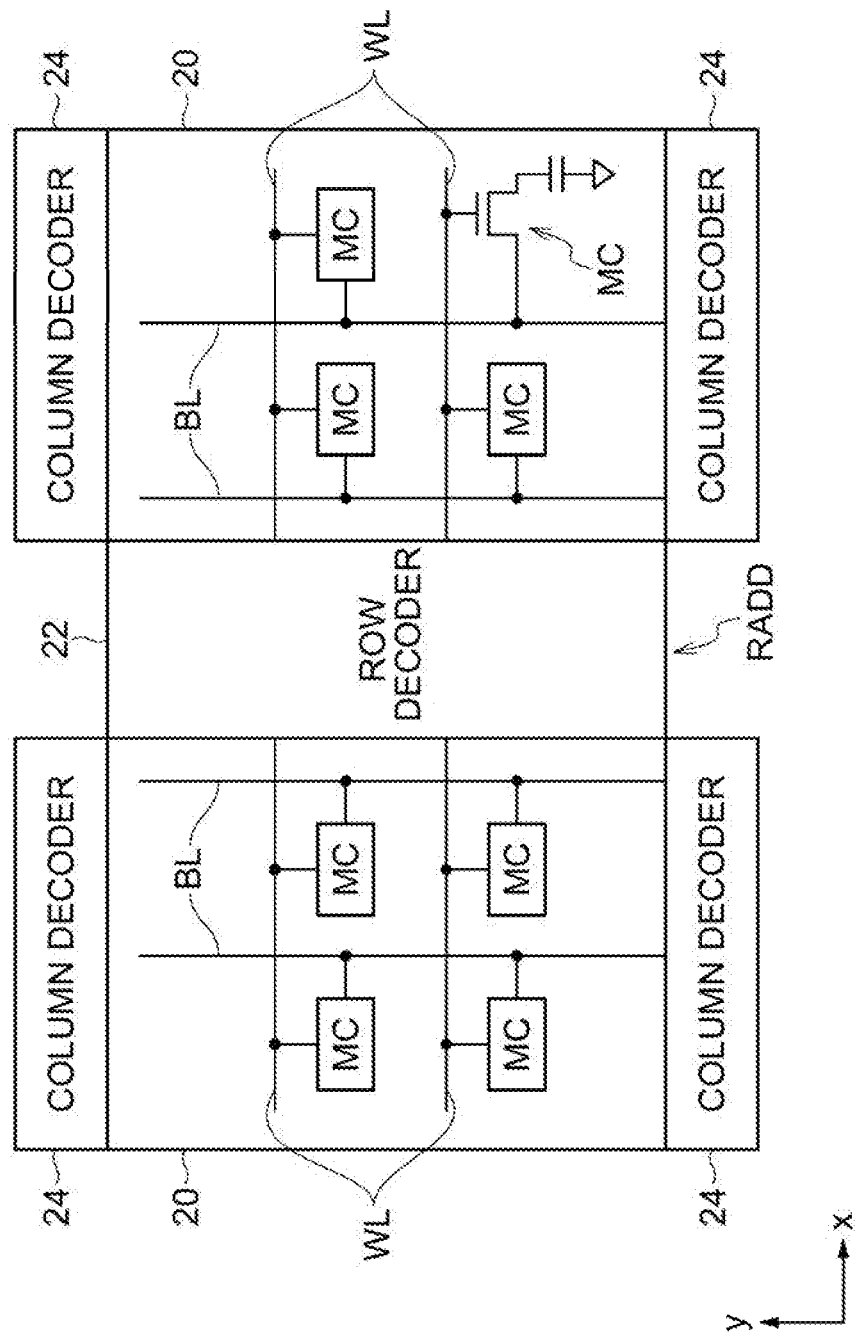
FIG. 2 is a diagram indicating a memory mat.

As shown in FIG. 2, each memory mat has a memory cell army 20 including a plurality of word lines WL extending in the x direction, a plurality of bit lines BL extending in the y direction, and a plurality of memory cells MC respectively placed at intersections between the word lines WL and the bit lines BL. In an example shown in FIG. 2, the memory cell array 20 is divided into two parts in the x direction and a row decoder 22 that selects a word line WL is placed between the two memory cell arrays 20. Column decoders 24 that respectively select bit lines BL are placed on both ends of the memory cell arrays 20 in the y direction. The memory cells MC are DRAM cells each including a cell transistor and a cell capacitor connected in series. Because the DRAM cells are volatile cells, data stored in the DRAM cells needs to be held by a periodic refresh operation. If accesses are concentrated to the same word line WL, information storage characteristics of memory cells MC coupled to word lines WL adjacent to that word line WL may be decreased. Accordingly, the row hammer refresh operation should be performed in addition to the normal refresh operation to prevent loss of information in the memory cells MC coupled to the word lines WL adjacent to the word line WL to which accesses are concentrated.

Figure 3:
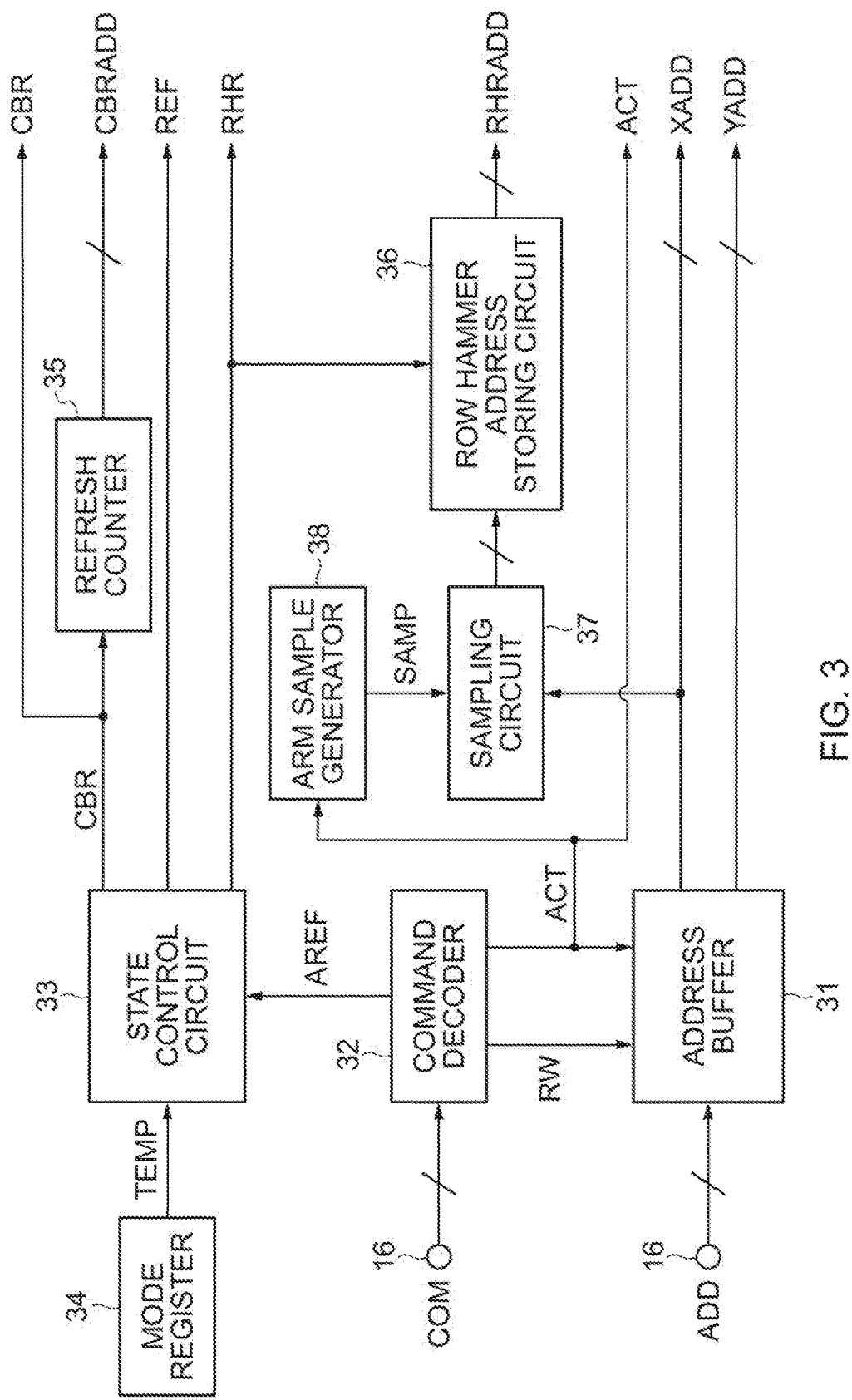
FIG. 3 is a block diagram indicating a part of the control logic circuit shown in FIG. 1.

FIG. 3 is a block diagram indicating a configuration of relevant parts of the control logic circuit 14 shown in FIG. 1. As shown in FIG. 3, the control logic circuit 14 has an address buffer 31 to which the external address signal ADD is input, and a command decoder 32 to which the external command signal COM is input. The command decoder 32 activates an active signal ACT when the external command signal COM indicates an active command, activates a read/write signal RW when the external command COM indicates a read command or a write command, and activates a refresh signal AREF when the external command signal COM indicates a refresh command. The address buffer 31 outputs the external address signal ADD as a row address XADD when the active signal ACT is activated, and outputs the external address signals ADD as a column address YADD when the read/write signal RW is activated. The row address XADD is used for selection of a word line WL using the row decoder 22 and the column address YADD is used for selection of a bit line BL using the column decoder 24. The external address signal ADD includes also a bank address that designates one of the memory banks BANK0 to BANK7.

The refresh signal AREF is supplied to a state control circuit 33. The state control circuit 33 activates internal signals REF, CBR, and RHR in a predetermined order when the refresh signal AREF is activated. The state control circuit 33 can be configured to receive a temperature signal TEMP set in a mode register 34 and switch the operation mode on the basis of the temperature signal TEMP. The internal signal CBR generated by the state control circuit 33 is a signal for performing a normal refresh operation. The internal signal CBR is supplied to a refresh counter 35. The refresh counter 35 holds an address CBRADD of a word line WL being a target of refresh operation. The value of the address CBRADD held in the refresh counter 35 is incremented or decremented each time the internal signal CBR is activated. In the present embodiment, upper three bits of the address CBRADD held in the refresh counter 35 are degenerated and therefore there are eight word lines WL corresponding to one address CBRADD. Meanwhile, the internal signal RHR is a signal for performing a row hammer refresh operation. The internal signal RHR is supplied to a row hammer address storing circuit 36. The row hammer address storing circuit 36 stores therein the address of a word line WL being a target of the row hammer refresh operation, or an address related thereto. For example, the address stored in the row hammer address storing circuit 36 may be the address itself of a word line WL to which accesses are concentrated, or may be the address of a word line WL adjacent to the word line WL to which accesses are concentrated. A plurality of addresses (four addresses, for example) are stored in the row hammer address storing circuit 36, and an output address RHRADD is switched each time the internal signal RHR is activated.

The address stored in the row hammer address storing circuit 36 is provided by a sampling circuit 37. The sampling circuit 37 samples the row address XADD at a timing when a sampling signal SAMP generated by an arm sample generator 38 is activated, and overwrites the sampled row address XADD in the row hammer address storing circuit 36. The arm sample generator 38 may activate the sampling signal SAMP at a timing when the active signal ACT has been activated a predetermined number of times. Accordingly, the address of the word line WL to which accesses are concentrated is stored in the row hammer address storing circuit 36.

Figure 4:
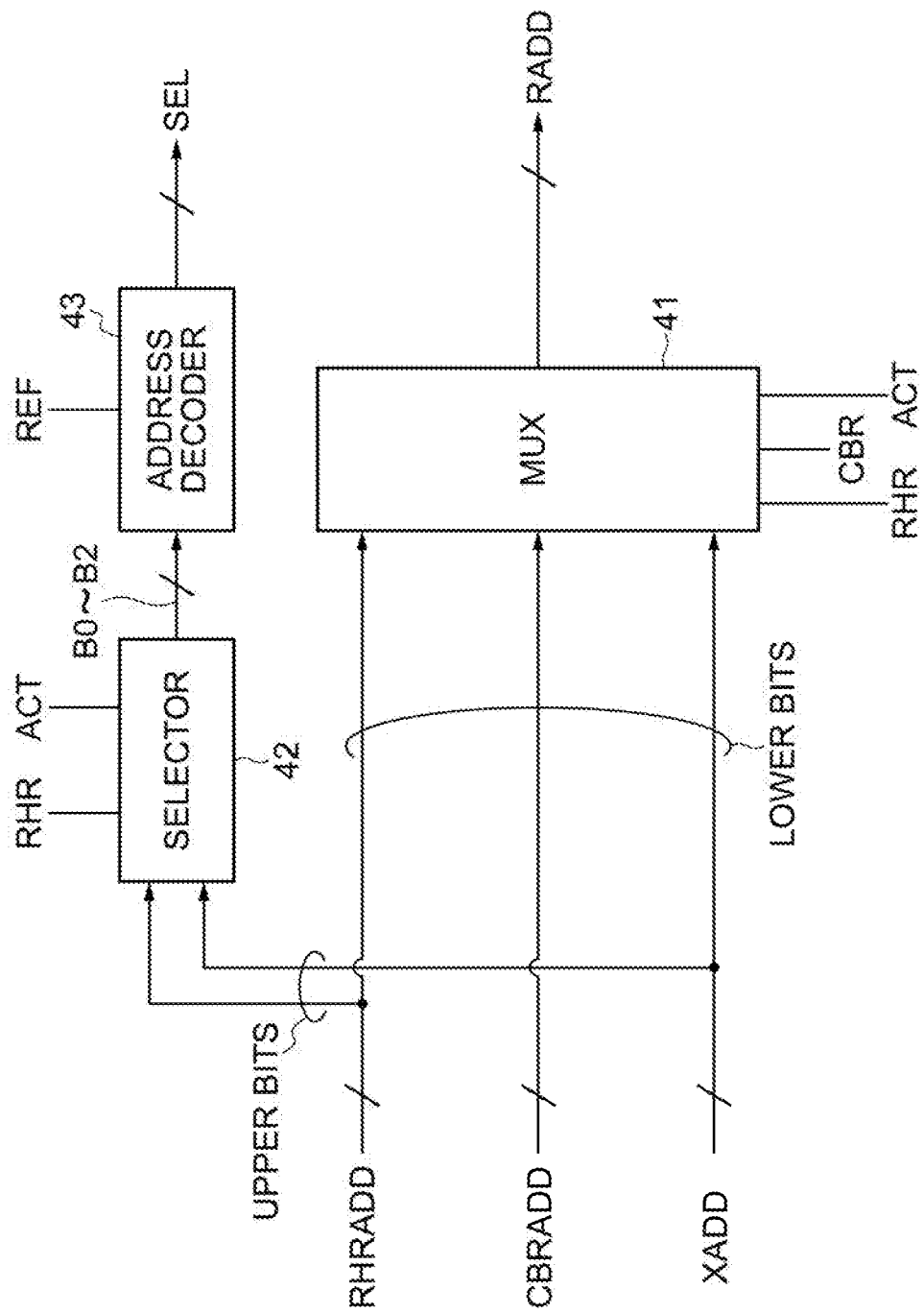
FIG. 4 is a block diagram indicating a part of the bank row logic circuit shown in FIG. 1.

The internal signals REF, CBR, and RHR, the active signal ACT, and the address signals XADD, CBRADD, and RHRADD generated by the control logic circuit 14 are supplied to the bank row logic circuit 12 allocated to a designated memory bank. As shown in FIG. 4, the bank row logic circuit 12 has a multiplexer 41, a selector 42, and an address decoder 43. The multiplexer 41 receives the respective lower bits of the address signals XADD and RHRADD and the address signal CBRADD and selects one of the respective lower bits of the address signals XADD and RHRADD and the address signal CBRADD as a row address RADD on the basis of the active signal ACT and the internal signals CBR and RHR. That is, the bank row logic circuit 12 selects the lower bits of the address signal XADD as the row address RADD when the active signal ACT is activated, selects the address signal CBRADD as the row address RADD when the internal signal CBR is activated, and selects the lower bits of the address signal RHRADD as the row address RADD when the internal signal RHR is activated. The row address RADD output from the multiplexer 41 is supplied to the row decoder 22 shown in FIG. 2. The row decoder 22 selects a word line WL indicated by the row address RADD.

Meanwhile, respective upper bits (three bits in the present embodiment) of the address signals XADD and RHRADD are supplied to the selector 42. The selector 42 supplies bit data B0 to B2 being the upper bits of either the address signal XADD or the address signal RHRADD to the address decoder 43 on the basis of the active signal ACT and the internal signal RHR. The address decoder 43 decodes the bit data B0 to B2 to generate a selection signal SEL used for mat selection.

Figure 5:
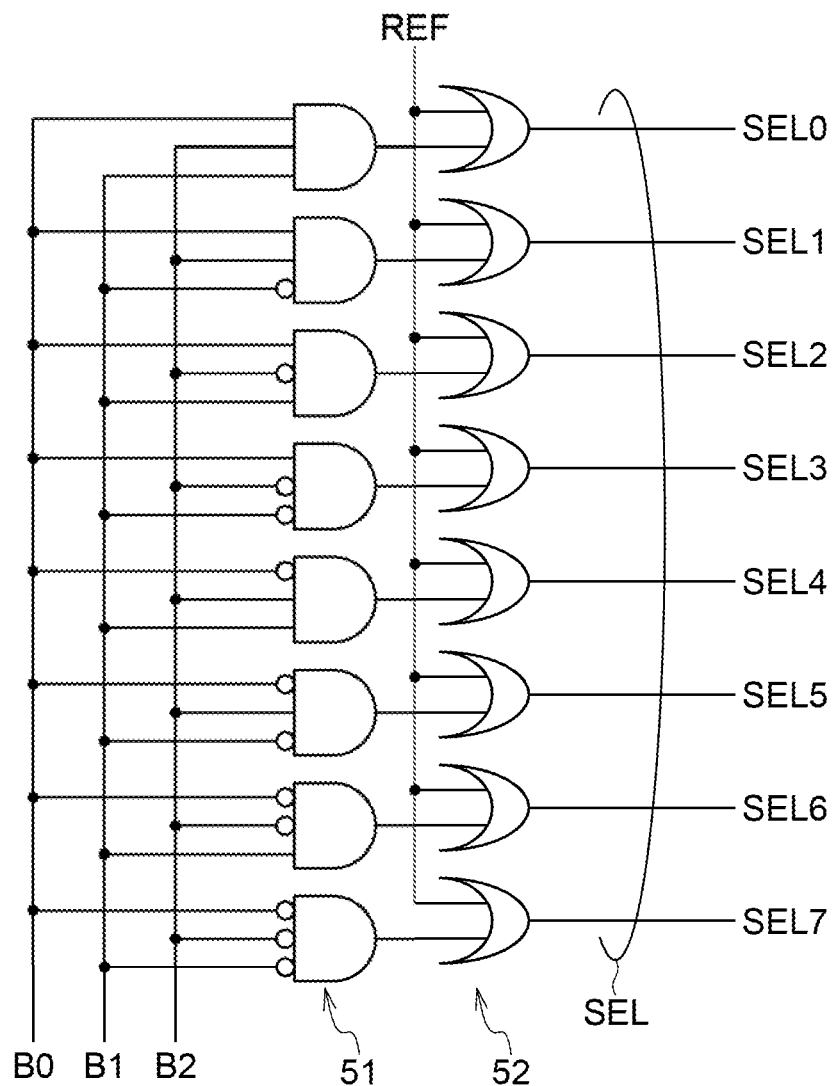
FIG. 5 is a circuit diagram indicating the address decoder shown in FIG. 5.

As shown in FIG. 5, the address decoder 43 has an AND gate circuit group 51 that decodes the bit signals B0 to B2 being the upper bits of the address signal XADD or RHRADD, and an OR gate circuit group 52 connected at the subsequent stage of the AND gate circuit group 51. Ones of input nodes of OR gate circuits constituting the OR gate circuit group 52 are respectively supplied with outputs of the corresponding AND gate circuits, and the internal signal REF is input in common to the other input nodes. The internal signal CBR can be used instead of the internal signal REF to be supplied to the OR gate circuit group 52. With this configuration, during a period in which the internal signal REF is not activated, that is, at a time of the normal row access or the row hammer refresh operation, one of selection signals SEL0 to SEL7 is activated on the basis of the bit signals B0 to B2. The selection signals SEL0 to SEL7 correspond to the memory mats MAT0 to MAT7, respectively. Accordingly, at a time of the normal row access or the row hammer refresh operation, one of the memory mats MAT0 to MAT7 is selected and the remaining seven memory mats are in a non-selected state. In contrast thereto, during a period in which the internal signal REF is activated, that is, at a time of the normal refresh operation, the bit signals B0 to B2 are invalidated and the selection signals SEL0 to SEL7 are all activated. Therefore, the eight memory mats MAT0 to MAT7 are all selected at a time of the normal refresh operation.

Figure 6:
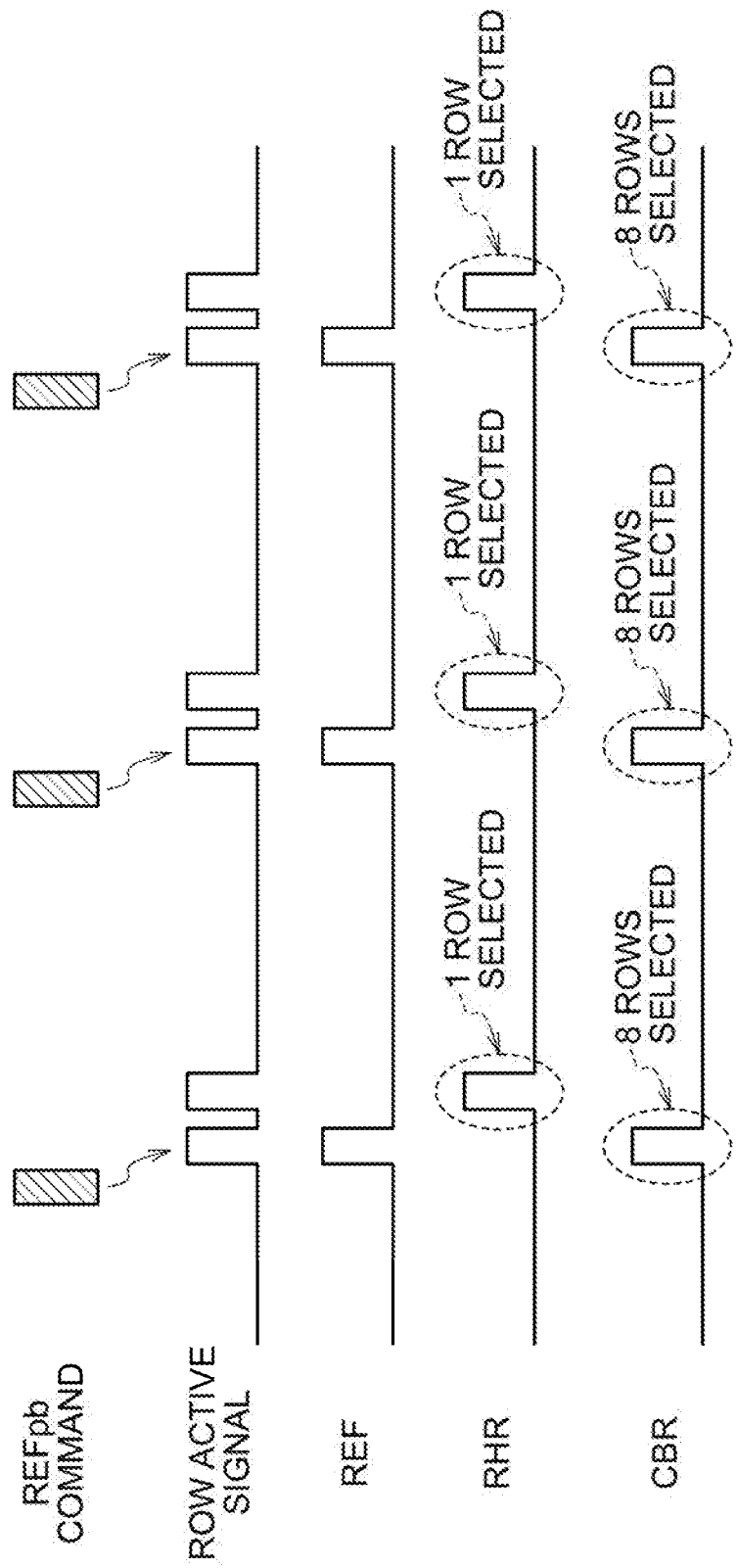
FIG. 6 is a timing chart for explaining an operation of the semiconductor device according to the first embodiment of the present disclosure.

FIG. 6 is a timing chart for explaining an operation of the semiconductor device 1 according to the present embodiment when a per-bank refresh command REFpb is issued thereto. In the present embodiment, when the per-bank refresh command REFpb is issued from outside, a row active signal is generated twice consecutively in the state control circuit 33 as shown in FIG. 6. The internal signals REF and CBR are activated synchronously with the first activation of the row active signal and the internal signal RHR is activated synchronously with the second activation of the row active signal. Accordingly the normal refresh operation is performed in response to the first activation of the row active signal and the row hammer refresh operation is performed in response to the second activation of the row active signal. That is, the normal refresh operation and the row hammer refresh operation are performed sequentially in response to one per-bank refresh command REFpb.

Figure 7A:
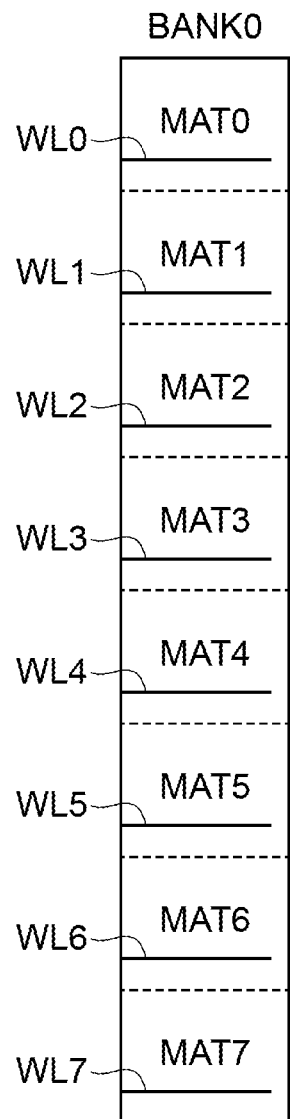
FIG. 7A is a schematic diagram for explaining an operation of the semiconductor device according to the first embodiment of the present disclosure responsive to the first occurrence of the row active signal.
Figure 7B:
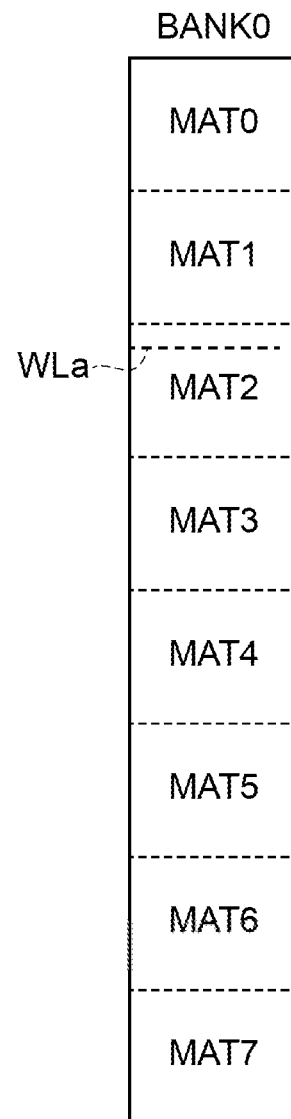
FIG. 7B is a schematic diagram for explaining an operation of the semiconductor de-ice according to the first embodiment of the present disclosure responsive to the second occurrence of the row active signal.

As shown in FIG. 7A, for example, when the per-bank refresh command REFpb designates the memory bank BANK0, the memory mats MAT0 to MAT7 of the memory bank BANK0 are all selected in response to the first activation of the row active signal, and eight word lines WL0 to WL7 indicated by the address signal CBRADD input from the refresh counter 35 are selected simultaneously. These word lines WL0 to WL7 belong to the memory mats MAT0 to MAT7, respectively. As shown in FIG. 7B, one word line WLa which is indicated by the address signal RHRADD output from the row hammer address storing circuit 36 among the word lines WL included in the memory bank BANK0 is then selected in response to the second activation of the row active signal. A memory mat (MAT2 in an example shown in FIG. 7B) to which the word line WLa belongs is designated by the bit signals B0 to B2 being the upper bits of the address signal RHRADD. Selection of the word line WLa in the relevant memory mat MAT2 is performed on the basis of the lower bits of the address signal RHRADD.

In the present embodiment, both the normal refresh operation and the row hammer refresh operation are thus performed sequentially in response to one per-bank refresh command REFpb and therefore the number of the normal refresh operations does not decrease. Accordingly, the refresh cycle is not elongated due to the row hammer refresh operation. Furthermore, because the row hammer fresh operation is performed each time the per-bank refresh command REFpb is issued, the execution frequency of the row hammer refresh operations is also increased. At the time of the row hammer refresh operation, only one word line WL is selected. Accordingly, increase in current consumption and noise occurring due to execution of the row hammer refresh operation can be minimized. In the example described above, the normal refresh operation and the row hammer refresh operation are performed in this order in response to the per-bank refresh command REFpb. However, the present invention is not limited thereto. Therefore, the row hammer refresh operation and the normal refresh operation can be performed in this order in response to the per-bank refresh command REFpb. The length of a word-line selection time (a sensing time in a sense amplifier) at a time when the internal signal CBR is activated can be longer than the length of a word-line selection time at a time when the internal signal RHR is activated considering that eight word lines are selected at the time of an activation of the internal signal CBR in the example described above and one word line is selected at the time of an activation of the internal signal RHR. This is because, when the internal signal CBR is activated, eight word lines are selected and it is therefore supposed that load is larger than that at a time of selection of one word line and that relatively long time is required. This control can be realized by delaying a timing of a control signal for deactivating the word lines in response to the internal signal CBR, for example, using a delay circuit.

Figure 8:
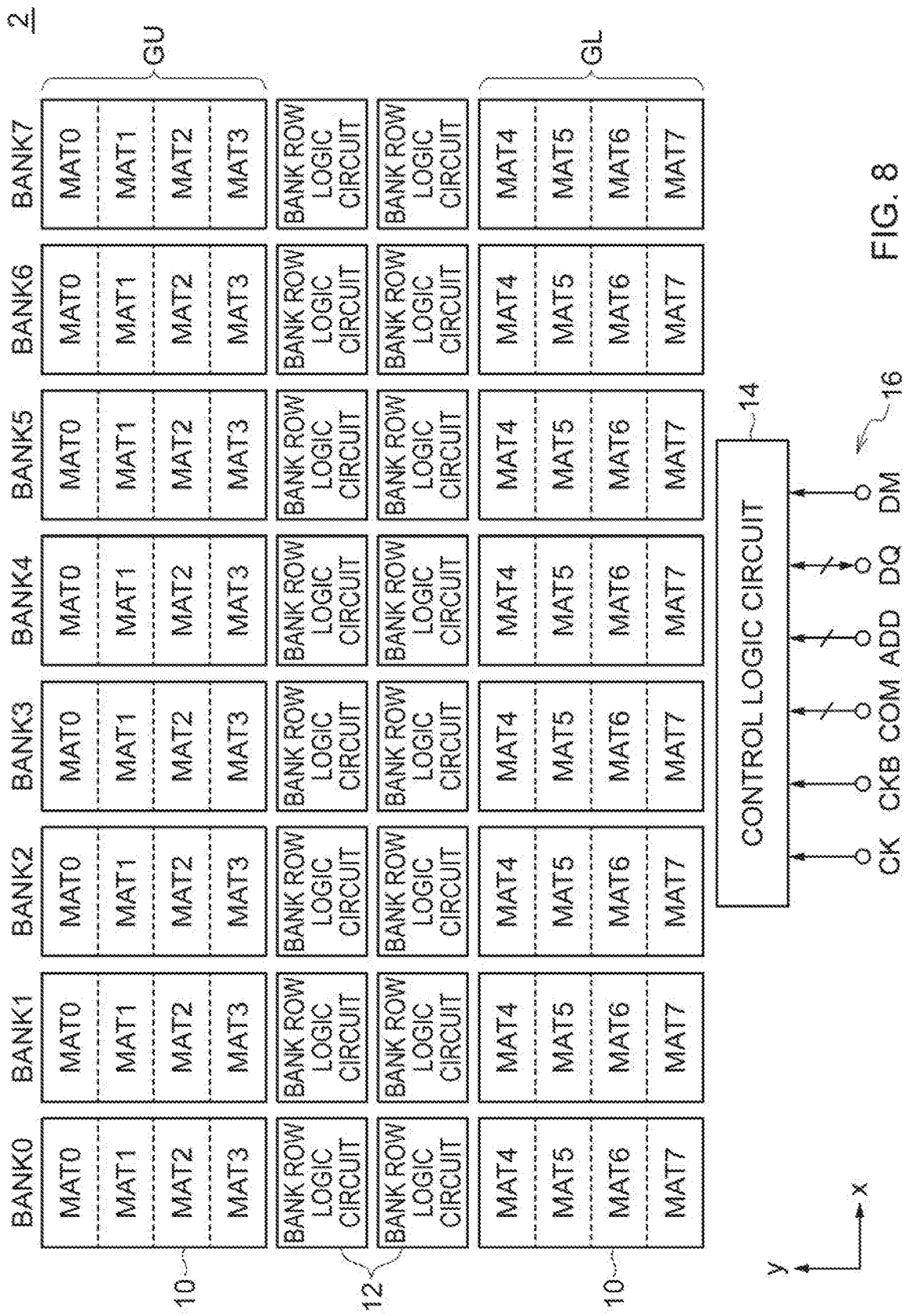
FIG. 8 is a block diagram of a semiconductor device according to a second embodiment of the present disclosure.

In a semiconductor device 2 according to a second embodiment shown in FIG. 8, the memory mats MAT0 to MAT7 included in each of the memory banks BANK0 to BANK7 are divided into two groups GU and GL and the bank row logic circuit 12 is provided for each of the groups GU and GL. The rest of the fundamental configuration is the same as that of the semiconductor device 1 according to the first embodiment shown in FIG. 1.

Figure 9:
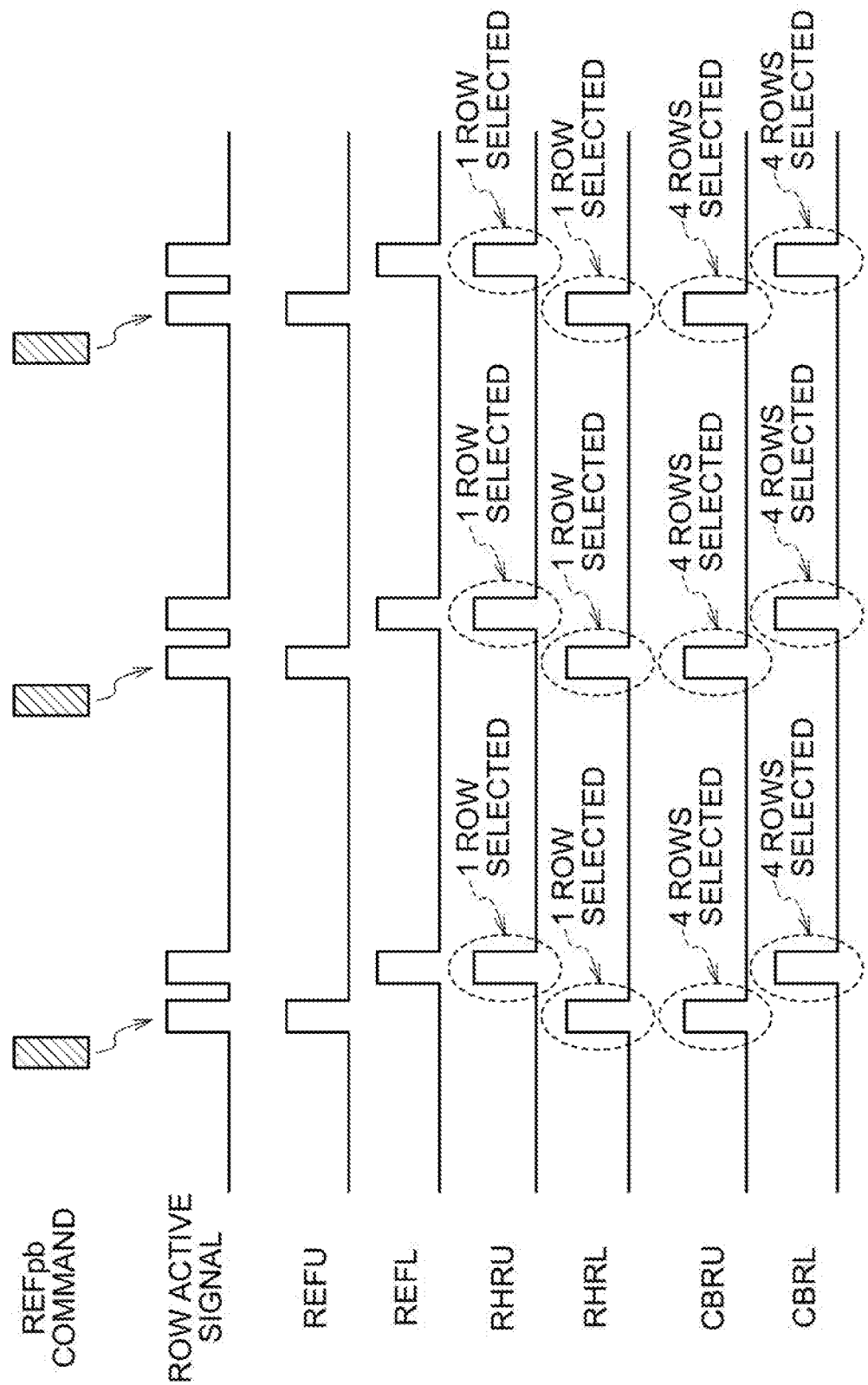
FIG. 9 is a timing chart for explaining an operation of the semiconductor device according to the second embodiment of the present disclosure.

FIG. 9 is a timing chart for explaining an operation of the semiconductor device 2 according to the present embodiment when the per-bank refresh command REFpb is issued thereto. In the present embodiment, the internal signals REF, CBR, and RHR are allocated to each of the groups GU and GL as shown in FIG. 9. That is, internal signals REFU, CBRU, and RHRU are allocated to the group GU and internal signals REFL, CBRL, and RHRL are allocated to the group GL.

When the per-bank refresh command REFpb is issued, the row active signal is generated twice consecutively in the state control circuit 33. The internal signals REFU, CBRU, and RHRL are activated synchronously with the first activation of the row active signal, and the internal signals REFL, CBRL, and RHRU are activated synchronously with the second activation of the row active signal. Accordingly, the normal refresh operation is performed to the group GU and the row hammer refresh operation is performed to the group GL in response to the first activation of the row active signal. In response to the second activation of the row active signal, the normal refresh operation is performed to the group GL and the row hammer refresh operation is performed to the group GU.

Figure 10A:
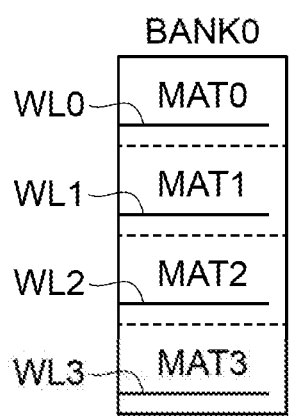
FIG. 10A is a schematic diagram for explaining an operation of the semiconductor device according to the second embodiment of the present disclosure responsive to the first occurrence of the row active signal.
Figure 10B:
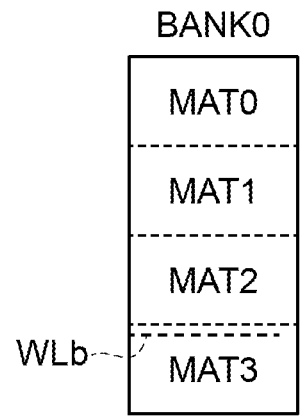
FIG. 10B is a schematic diagram for explaining an operation of the semiconductor device according to the second embodiment of the present disclosure responsive to the second occurrence of the row active signal.

For example, when the per-bank refresh command REFpb designates the memory bank BANK0, the mats MAT0 to MAT3 of the memory bank BANK0 are all selected in response to the first activation of the row active signal, and the word lines WL0 to WL3 indicated by the address signal CBRADD output from the refresh counter 35 are simultaneously selected and a word line WLa which is indicated by the address signal RHRADD output from the row hammer address storing circuit 36 is selected from among the word lines WL included in the mats MAT4 to MAT7 as shown in FIG. 10A. A memory mat (MAT5 in an example shown in FIG. 10A) to which the word line WLa belongs is designated by the bit signals B0 to B2 being the upper bits of the address signal RHRADD. As shown in FIG. 10B, the mats MAT4 to MAT7 of the memory bank BANK0 are all selected in response to the second activation of the row active signal, and the word lines WL4A to WL7 indicated by the address signal CBRADD output from the refresh counter 35 are simultaneously selected and a word line WLb indicated by the address signal RHRADD output from the row hammer address storing circuit 36 is selected from among the word lines WL included in the mats MAT0 to MAT3. A memory mat (MAT3 in an example shown in FIG. 10B) to which the word line WLb belongs is designated by the bit signals B0 to B2 being the upper bits of the address signal RHRADD.

As described above, in the present embodiment the normal refresh operation of selecting four word lines WL and the row hammer refresh operation of selecting one word line WL are simultaneously performed and the above operations are performed twice consecutively. Therefore, the number of word lines WL selected by one operation is reduced, which can suppress the peak current. Furthermore, because the row hammer refresh operation is performed twice in response to one per-bank refresh command REFpb, the execution frequency of the row hammer refresh operations is doubled as compared to that in the semiconductor device 1 according to the first embodiment.

Figure 11:
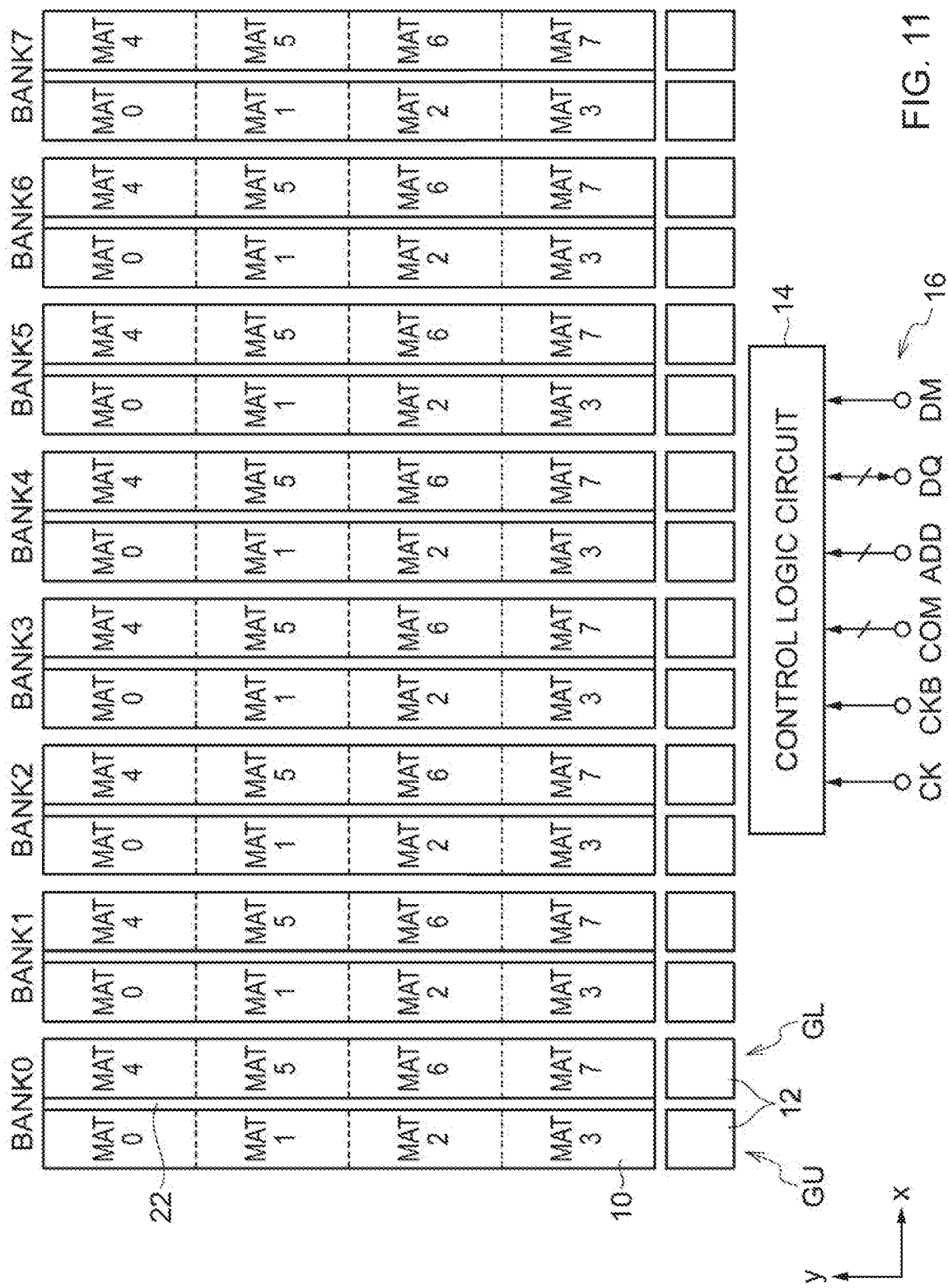
FIG. 11 is a block diagram of a semiconductor device according to a third embodiment of the present disclosure.

In a semiconductor device 3 according to a third embodiment shown in FIG. 11, the memory mats MAT0 to MAT7 included in each of the memory banks BANK0 to BANK7 are divided into two groups GU and GL and the bank row logic circuit 12 is provided for each of the groups GU and GL similarly in the semiconductor device 2 according to the second embodiment shown in FIG. 8. The semiconductor device 3 according to the third embodiment is different from the semiconductor device 2 according to the second embodiment shown in FIG. 8 in that the group GU and the group GL are arrayed in the x direction and the row decoder 22 is placed therebetween. The rest of the fundamental configuration is the same as that of the semiconductor device 2 according to the second embodiment shown in FIG. 8.

In the present embodiment, the operation performed when the per-bank refresh command REFpb is issued is the same as the operation explained with reference to FIG. 9. That is, the normal refresh operation is performed to the group GU and the row hammer refresh operation is performed to the group GL in response to the first activation of the row active signal, and the normal refresh operation is performed to the group GL and the row hammer refresh operation is performed to the group GU in response to the second activation of the row active signal.

Figure 12A:
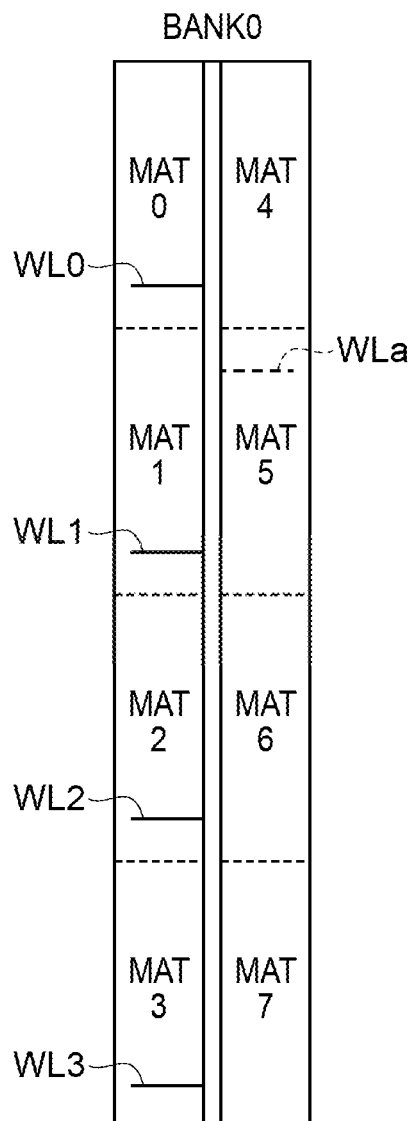
FIG. 12A is a schematic diagram for explaining an operation of the semiconductor device according to the third embodiment of the present disclosure responsive to the first occurrence of the row active signal.
Figure 12B:
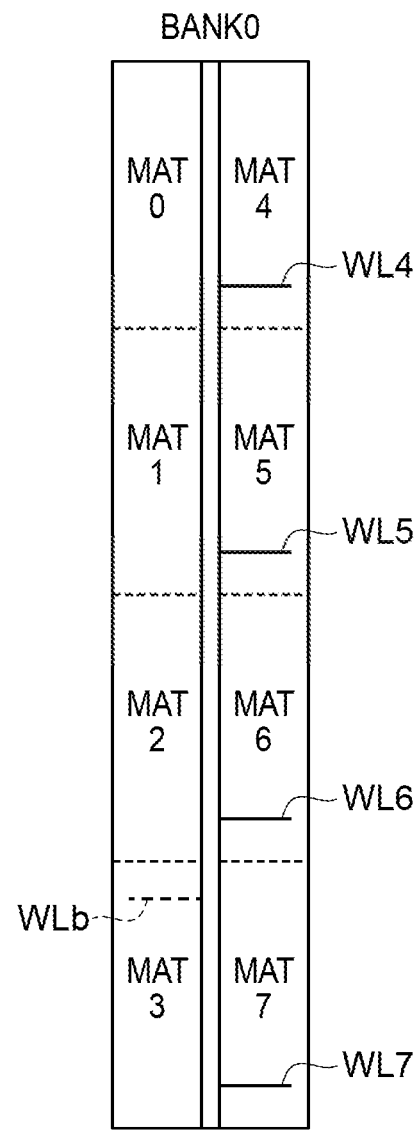
FIG. 12B is a schematic diagram for explaining an operation of the semiconductor device according to the third embodiment of the present disclosure responsive to the second occurrence of the row active signal.

For example, when the per-bank refresh command REFpb designates the memory bank BANK0, the mats MAT0 to MAT3 of the memory bank BANK0 are all selected in response to the first activation of the row active signal, and the word lines WL0 to WL3 indicated by the address signal CBRADD output from the refresh counter 35 are simultaneously selected and a word line WLa indicated by the address signal RHRADD output from the row hammer address storing circuit 36 is selected from among the word lines WL included in the mats MAT4 to MAT7 as shown in FIG. 12A. A memory mat (MAT5 in an example shown in FIG. 12A) to which the word line WLa belongs is designated by the bit signals B0 to B2 being the upper bits of the address signal RHRADD. The mats MAT4 to MAT7 of the memory bank BANK0 are then all selected in response to the second activation of the row active signal, and the word lines WL4 to WL7 indicated by the address signal CBRADD output from the refresh counter 35 are simultaneously selected and a word line WLb indicated by the address signal RHRADD output from the row hammer address storing circuit 36 is selected from among the word lines WL included in the mats MAT0 to MAT3 as shown in FIG. 12B. A memory mat (MAT3 in an example shown in FIG. 12B) to which the word line WLb belongs is designated by the bit signals B0 to B2 being the upper bits of the address signal RHRADD.

Figure 13A:
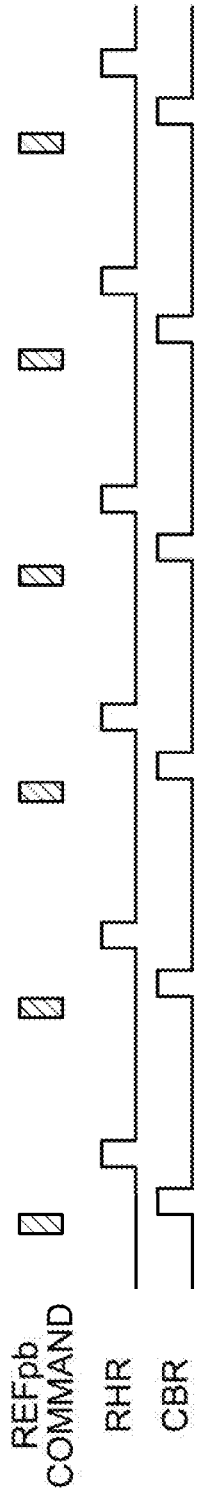
FIG. 13A is a timing chart for explaining an operation of the semiconductor device according to the first embodiment of the present disclosure in a case where the temperature is middle.
Figure 13B:
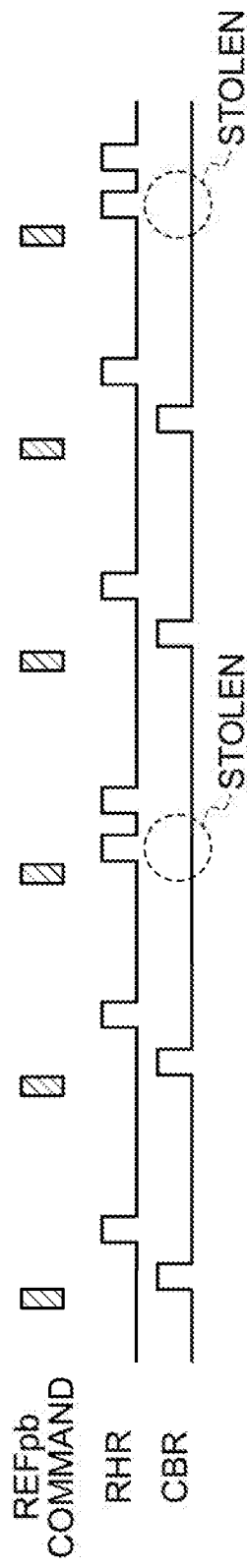
FIG. 13B is a timing chart for explaining an operation of the semiconductor device according to the first embodiment of the present disclosure in a case where the temperature is low.
Figure 13C:
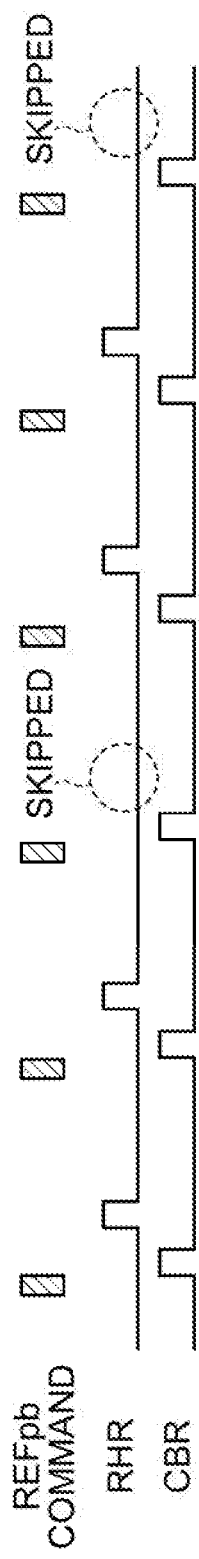
FIG. 13C is a timing chart for explaining an operation of the semiconductor device according to the first embodiment of the present disclosure in a case where the temperature is high.

The operation mode of the refresh operation in response to the per-bank refresh command REFpb can be changed by the temperature signal TEMP shown in FIG. 3. For example, when the temperature signal TEMP indicates a normal temperature state, the internal signals CBR and RHR are successively activated each time the per-bank refresh command REFpb is issued as shown in FIG. 13A, whereby the normal refresh operation and the row hammer refresh operation are sequentially performed. When the temperature signal TEMP indicates a low temperature state, the internal signals CBR and RHR are successively activated in principle each time the per-bank refresh command REFpb is issued while the internal signal RHR is activated twice consecutively without activating the internal signal CBR once every predetermined number of the per-bank refresh commands REFpb as shown in FIG. 13B (once every three per-bank refresh commands REFpb in an example shown in FIG. 13B). This increases the frequency of the row hammer refresh operations and therefore a sufficient number of the row hammer refresh operations per unit time is ensured even if the issuance period of the per-bank refresh command REFpb becomes longer due to the low temperature state. On the other hand, when the temperature signal TEMP indicates a high temperature state, the internal signals CBR and RHR are successively activated in principle each time the per-bank refresh command REFpb is issued while the internal signal CBR is activated only once without activating the internal signal RHR once every predetermined number of the per-bank refresh commands REFpb as shown in FIG. 13C (once every three per-bank refresh commands REFpb in an example shown in FIG. 13C). Because the row hammer refresh operation is thus skipped periodically, increase in the current consumption caused by execution of the row hammer refresh operation more than necessary can be suppressed even if the issuance period of the per-bank refresh command REFpb becomes shorter due to the high temperature state.

Figure 14A:
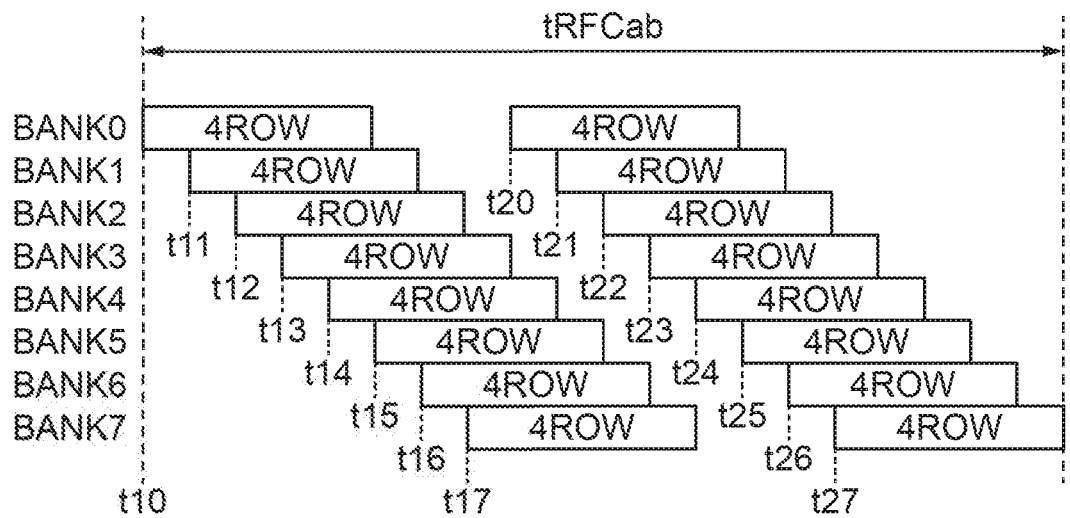
FIGS. 14A and 14B are timing charts for explaining an operation when an all-bank refresh command is issued.
Figure 14B:
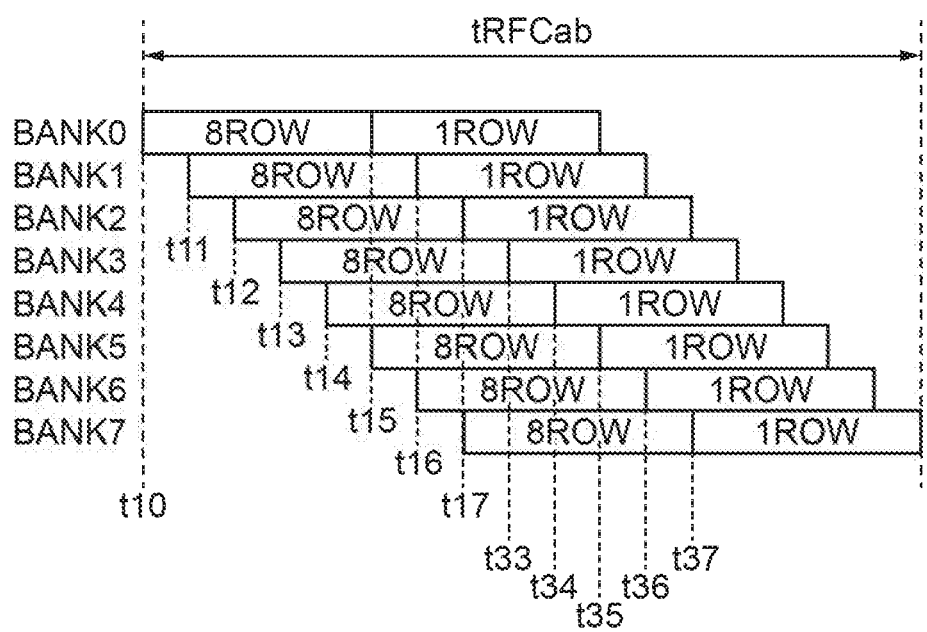

FIGS. 14A and 14B are timing charts for explaining an operation when an all-bank refresh command REFab is issued from outside. In an example shown in FIG. 14A, when the all-bank refresh command REFab is issued, the normal refresh operation is performed to four word lines WL included in each of the memory banks BANK0 to BANK7 (word lines WL respectively included in the memory mats MAT0 to MAT3, for example) at times t10 to t17, and the normal refresh operation is performed to different four word lines WL included in each of the memory banks BANK0 to BANK7 (word lines WL respectively included in the memory mats MAT4 to MAT7, for example) at times t20 to t27, respectively. Accordingly, a total of eight word lines WL is refreshed in each of all the memory banks BANK0 to BANK7. In contrast thereto, in an example shown in FIG. 14B, when the all-bank refresh command REFab is issued, the normal refresh operation is performed to eight word lines WL included in each of the memory banks BANK0 to BANK7 (word lines WL respectively included in the memory mats MAT0 to MAT7, for example) at the times t10 to t17, and the row hammer refresh operation is performed to one word line WL included in each of the memory banks BANK0 to BANK7 at the times t15 to t17 and times t33 to t37, respectively. Accordingly, in response to one all-bank refresh command REFab, the row hammer refresh operation for all the memory banks BANK0 to BANK7 can be performed. Besides, the normal refresh operation for the memory bank BANK5 and the row hammer refresh operation for the memory bank BANK0 are simultaneously started, the normal refresh operation for the memory bank BANK6 and the row hammer refresh operation for the memory bank BANK1 are simultaneously started, and the normal refresh operation for the memory bank BANK7 and the row hammer refresh operation for the memory bank BANK2 are simultaneously started. Therefore, a time tRF-Cab required for a series of operations can be shortened. Furthermore, the maximum number of word lines simultaneously refreshed is suppressed to nine, which minimizes occurrence of noise of a power supply and the like.

Figure 15:
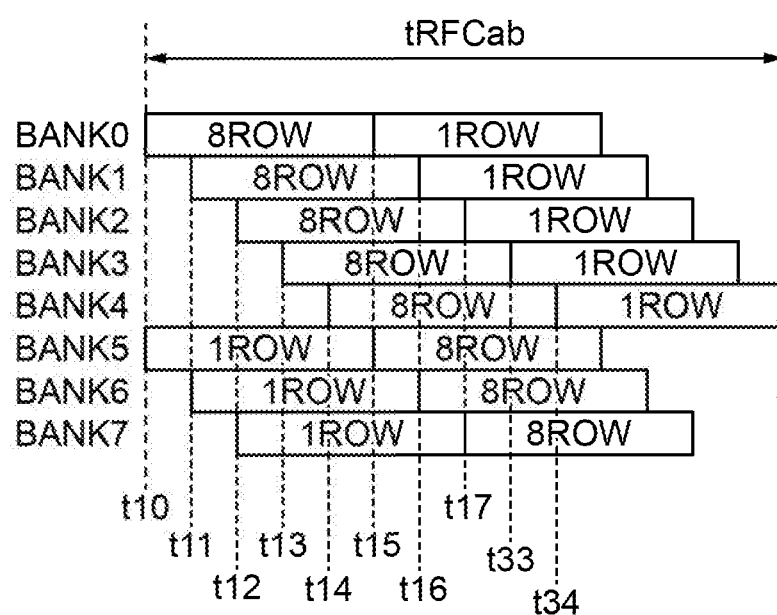
FIG. 15 is a timing chart for explaining another operation when an all-bank refresh command is issued.

FIG. 15 is a timing chart for explaining an operation according to a modification when the all-bank refresh command REFab is issued from outside. In an example shown in FIG. 15, when the all-bank refresh command REFab is issued, the normal refresh operation is performed to eight word lines WL included in each of the memory banks BANK0 to BANK7 at the times t10 to t17 and the row hammer refresh operation is performed to one word line WL included in each of the memory banks BANK0 to BANK7 at the times t10 to t12, t15 to t17, t33, and t34, respectively. Accordingly, similarly to the example shown in FIG. 14B, the row hammer refresh operations for all the memory banks BANK0 to BANK7 can be performed in response to one all-bank refresh command REFab. Besides, the time tRFCab required for a series of operations can be further shortened as compared to the case shown in FIG. 14B because the normal refresh operations for the memory banks BANK0 to BANK2 and BANK5 to BANK7 and the row hammer refresh operations for the memory banks BANK5 to BANK7 and BANK0 to BANK2 are simultaneously started, respectively.

Figure 16:
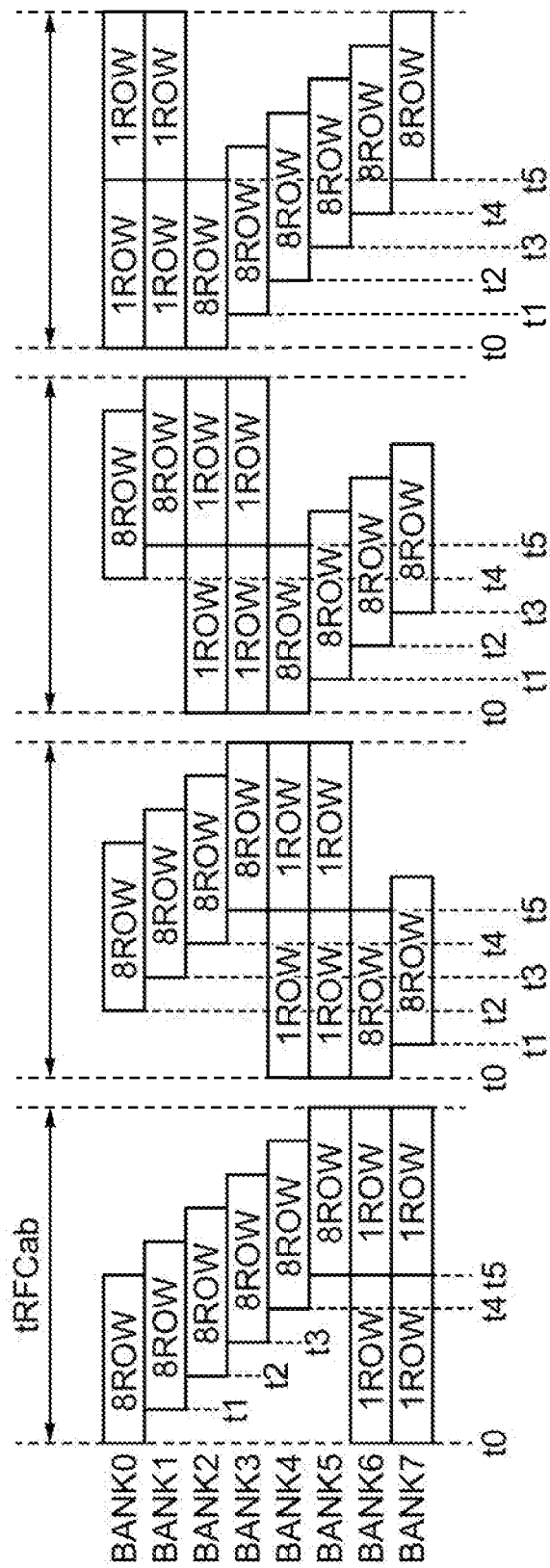
FIGS. 16A to 16D are timing charts for explaining still another operation when an all-bank refresh command is issued.

FIGS. 16A to 16D are timing charts for explaining an operation according to another modification when the all-bank refresh command REFab is issued from outside. First, when the fast all-bank refresh command REFab is issued, the normal refresh operations for the memory banks BANK0 to BANK5 are sequentially performed and the row hammer refresh operation is performed to the memory banks BANK6 and BANK7 twice, respectively, as shown in FIG. 16A. Next, when the second all-bank refresh command REFab is issued, the normal refresh operations for the memory banks BANK6, BANK7, and BANK0 to BANK3 are sequentially performed and the row hammer refresh operation is performed to the memory banks BANK4 and BANK5 twice, respectively, as shown in FIG. 16B. When the third all-bank refresh command REFab is issued, the normal refresh operations for the memory banks BANK4 to BANK7, BANK0, and BANK1 are sequentially performed and the row hammer refresh operation is performed to the memory banks BANK2 and BANK3 twice, respectively, as shown in FIG. 16C. When the fourth all-bank refresh command REFab is issued, the normal refresh operations for the memory banks BANK3 to BANK7 are sequentially performed and the row hammer refresh operation is performed to the memory banks BANK0 and BANK1 twice, respectively, as shown in FIG. 16D. Accordingly, when the all-bank refresh command REFab is issued four times in total, the normal refresh operation is performed three times to each of all the memory banks BANK0 to BANK7 and the row hammer refresh operation is performed twice to each of all the memory banks BANK0 to BANK7. This can shorten the time tRF-Cab required for a series of the operations more than in the example shown in FIG. 15.

Figure 17:
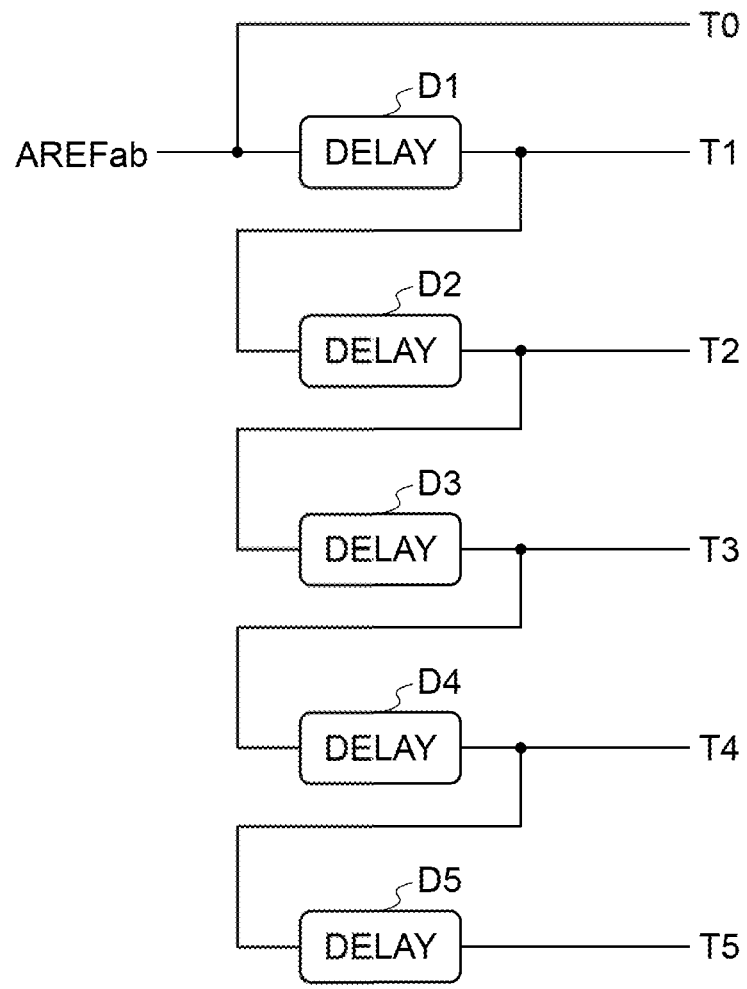
FIG. 17 is a diagram of a circuit for generating timing signals.
Figure 18:
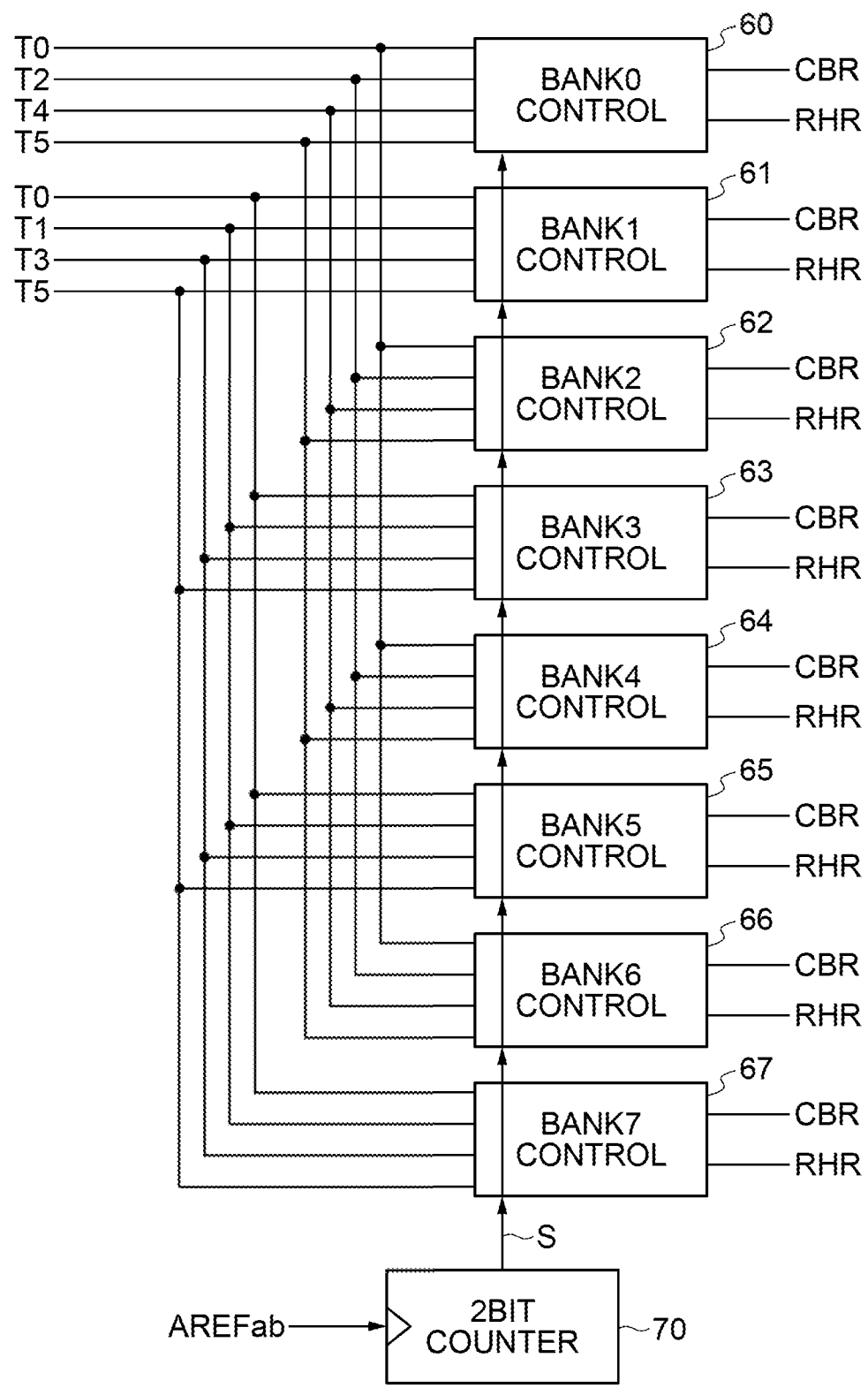
FIG. 18 is a block diagram of bank control circuits.

The operations shown in FIGS. 16A to 16D can be easily realized using a circuit shown in FIGS. 17 and 18. FIG. 17 shows a circuit for generating timing signals T0 to T5. In an example shown in FIG. 17, a plurality of delay circuits D1 to D5 are cascade connected and a refresh signal AREFab is input to the first delay circuit D1. The refresh signal AREFab is an internal signal activated each time the all-bank refresh command REFab is issued. With this configuration, when the all-bank refresh command REFab is issued, the delay circuits D1 to D5 are sequentially activated. The timing signals T0 to T5 are supplied to bank control circuits 60 to 67 shown in FIG. 18. Among these bank control circuits, the bank control circuits 60, 62, 64, and 66 corresponding to the memory banks BANK0, BANK2, BANK4, and BANK6 are supplied with the timing signals T0, T2, T4, and T5, and the bank control circuits 61, 63, 65, and 67 corresponding to the memory banks BANK1, BANK3, BANK5, and BANK7 are supplied with the timing signals T0, T1, T3, and T5. A state signal S is supplied from a 2-bit counter 70 to the bank control circuits 60 to 67 in common. The state signal S is a signal indicating which of the operations shown in FIGS. 16A to 16D is requested by a current all-bank refresh command REFab and is incremented each time the refresh signal AREFab is activated.

The bank control circuits 60 to 67 activate the internal signal CBR or RHR in response to the timing signals T0 to T5. As an example, when the state signal S indicates the operation shown in FIG. 16A, the bank control circuits 60 to 65 activate the internal signal CBR synchronously with the timing signals T0 to T5, respectively, and the bank control circuits 66 and 67 activate the internal signal RHR synchronously with the timing signals T0 and T5. Accordingly, the normal refresh operation is performed in the memory banks BANK0 to BANK5 synchronously with the times t0 to t5 shown in FIG. 16A, respectively, and the row hammer refresh operation is performed in the memory banks BANK6 and BANK7 synchronously with the times t0 and t5. Similarly, when the state signal S indicates the operation shown in FIG. 16B, the bank control circuits 66, 67, and 60 to 63 activate the internal signal CBR synchronously with the timing signals T0 to T5, respectively, and the bank control circuits 64 and 65 activate the internal signal RHR synchronously with the timing signals T0 and T5. Accordingly, the normal refresh operation is performed in the memory banks BANK6, BANK7, and BANK0 to BANK3 synchronously with the times t0 to t5 shown in FIG. 16B, respectively, and the row hammer refresh operation is performed in the memory banks BANK4 and BANK5 synchronously with the times t0 and t5.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising: responsive to receiving a first external all-bank refresh command: sequentially performing a refresh operation on each bank of a first plurality of memory banks; and performing a first row hammer refresh operation on a memory bank different from the first plurality of memory banks, wherein the first row hammer refresh operation is initiated synchronously with the refresh operation on a first bank of the first plurality of memory banks.

2. The method of claim 1, further comprising, performing a second row hammer refresh operation on the memory bank after the first row hammer refresh operation.

3. The method of claim 1, further comprising performing a second row hammer refresh operation on the memory bank synchronously with the refresh operation on a last bank of the first plurality of memory banks.

4. The method of claim 1, wherein the memory bank different from the first plurality of memory banks is included in a second plurality of memory banks and the method further comprises performing the first row hammer refresh operation on each of the second plurality of memory banks.

5. The method of claim 1, further comprising: responsive to receiving a second external all-bank refresh command: sequentially performing the refresh operation on each bank of the first plurality of memory banks except for a last bank of the first plurality of memory banks; performing the refresh operation on the memory bank different from the first plurality of memory banks as if the memory bank was the last bank of the first plurality of memory banks; and performing the first row hammer refresh operation on the last bank of the first plurality of memory banks.

6. The method of claim 5, further comprising performing a second row hammer refresh operation on the last bank of the first plurality of memory banks after the first row hammer refresh operation.

7. The method of claim 5, further comprising incrementing a counter each time an external all-bank refresh command is received, wherein a value of the counter indicates on which banks of the first plurality of memory banks and the memory bank different from the first plurality of banks the refresh operation is performed and the first row hammer refresh operation is performed.

8. The method of claim 1, wherein sequentially performing the refresh operation on each bank of the first plurality of banks is performed responsive, at least in part, to a plurality of timing signals, wherein each of the timing signals has a different delay.

* * * * *